United States Patent
Park

(10) Patent No.: US 10,716,201 B2
(45) Date of Patent: Jul. 14, 2020

(54) COMPONENT CARRIER AND METHOD TO PRODUCE SAID COMPONENT CARRIER

(71) Applicant: AT&S Austria Technologie & Systemtechnik Aktiengesellschaft, Leoben (AT)

(72) Inventor: Hyung Wook Park, Trofaiach (AT)

(73) Assignee: AT&S Austria Technologie & Systemtechnik Aktiengesellschaft (AT)

( * ) Notice: Subject to any disclaimer, the term of this patent is extended or adjusted under 35 U.S.C. 154(b) by 0 days.

(21) Appl. No.: 15/616,717

(22) Filed: Jun. 7, 2017

(65) Prior Publication Data

US 2017/0359889 A1  Dec. 14, 2017

(30) Foreign Application Priority Data

Jun. 8, 2016 (EP) .................................... 16173562

(51) Int. Cl.
*H05K 1/02* (2006.01)
*H01L 21/683* (2006.01)
(Continued)

(52) U.S. Cl.
CPC ......... *H05K 1/0204* (2013.01); *G06F 1/1626* (2013.01); *G06F 1/1635* (2013.01);
(Continued)

(58) Field of Classification Search
CPC . H01L 2224/32225; H01L 2924/15311; H01L 2224/97; H01L 2924/1517;
(Continued)

(56) References Cited

U.S. PATENT DOCUMENTS

| 4,921,041 A | 5/1990 | Akachi |
| 7,543,374 B2 | 6/2009 | Nakamura |

(Continued)

FOREIGN PATENT DOCUMENTS

| JP | 03255690 | 11/1991 |
| JP | 06181396 | 6/1994 |

(Continued)

OTHER PUBLICATIONS

Extended European Search Report for European Application No. 16173562.6, Search completed Nov. 9, 2016, dated Nov. 16, 2016, 8 Pgs.

(Continued)

Primary Examiner — Mandeep S Buttar
(74) *Attorney, Agent, or Firm* — KPPB LLP

(57) ABSTRACT

The invention relates to a component carrier for an electronic device, the component carrier comprising at least one heat-releasing component that is embedded within at least one carrier layer of the component carrier, and wherein the at least one embedded heat-releasing component is thermoconductively coupled to a heat spreader layer, characterized in that the heat spreader layer forms at least an outside section of a casing of said electronic device. Also an electronic device that comprises at least one component carrier according to the invention, as well as a method to produce a respective component carrier are indicated.

15 Claims, 5 Drawing Sheets

(51) Int. Cl.
    *H01L 23/36*         (2006.01)
    *H01L 23/433*       (2006.01)
    *H01L 21/48*         (2006.01)
    *G06F 1/16*          (2006.01)
    *G06F 1/20*          (2006.01)
    *H04B 1/3888*       (2015.01)
    *H05K 1/18*          (2006.01)

(52) U.S. Cl.
    CPC .......... *G06F 1/203* (2013.01); *H01L 21/4857* (2013.01); *H01L 21/6835* (2013.01); *H01L 23/36* (2013.01); *H01L 23/4334* (2013.01); *H04B 1/3888* (2013.01); *H05K 1/181* (2013.01); *H05K 2201/10522* (2013.01); *H05K 2201/10545* (2013.01)

(58) Field of Classification Search
    CPC .......... H01L 2924/181; H01L 23/5389; H01L 23/3128; H01L 24/24; H01L 23/49822; H01L 24/97; H01L 23/5383; H01L 2225/06589; H05K 1/185; H05K 1/0203; H05K 7/20436; H05K 3/0058
    USPC ....... 361/717, 704, 708, 709, 710, 713, 719; 257/777, 712; 438/106, 107, 113, 121, 438/125, 15, 25, 51
    See application file for complete search history.

(56) References Cited

U.S. PATENT DOCUMENTS

| | | | |
|---|---|---|---|
| 2002/0054480 A1* | 5/2002 | Jitaru | H01F 27/06 361/704 |
| 2003/0066638 A1 | 4/2003 | Qu et al. | |
| 2003/0164549 A1* | 9/2003 | Nakayama | H01L 23/3128 257/777 |
| 2003/0197285 A1 | 10/2003 | Strandberg | |
| 2004/0070946 A1 | 4/2004 | Matsuo et al. | |
| 2004/0118553 A1 | 6/2004 | Krassowski et al. | |
| 2004/0217466 A1 | 11/2004 | Lin | |
| 2005/0135061 A1 | 6/2005 | Kiley | |
| 2005/0135062 A1 | 6/2005 | Kiley et al. | |
| 2005/0231983 A1 | 10/2005 | Dahm | |
| 2006/0082972 A1 | 4/2006 | Kim | |
| 2007/0064396 A1 | 3/2007 | Oman | |
| 2007/0126099 A1* | 6/2007 | Aoki | B82Y 10/00 257/679 |
| 2009/0250807 A1* | 10/2009 | Lim | H01L 21/568 257/712 |
| 2010/0213601 A1* | 8/2010 | Smeys | H01L 21/4853 257/698 |
| 2011/0018123 A1* | 1/2011 | An | H01L 21/568 257/693 |
| 2011/0069448 A1* | 3/2011 | Weichslberger | H01L 23/5389 361/688 |
| 2012/0092109 A1 | 4/2012 | Chartouni et al. | |
| 2014/0192480 A1* | 7/2014 | Winkler | G06F 1/203 361/679.47 |
| 2014/0226284 A1 | 8/2014 | Yamauchi et al. | |
| 2014/0291866 A1 | 10/2014 | Ooi et al. | |
| 2017/0167799 A1 | 6/2017 | Silvano de Sousa et al. | |
| 2018/0096912 A1 | 4/2018 | de Sousa et al. | |

FOREIGN PATENT DOCUMENTS

| | | |
|---|---|---|
| JP | 2000138485 A | 5/2000 |
| JP | 2000304476 A | 11/2000 |
| JP | 2007043064 A | 2/2007 |
| JP | 2012182159 A | 9/2012 |
| WO | 2007061190 A1 | 5/2007 |
| WO | 2007096313 A1 | 8/2007 |
| WO | 2010121230 A1 | 10/2010 |
| WO | 2014137749 A1 | 9/2014 |
| WO | 2016071327 A1 | 5/2016 |

OTHER PUBLICATIONS

Extended European Search Report for European Application No. 16191722.4, Search completed Mar. 13, 2017, dated Mar. 20, 2017, 8 Pgs.

* cited by examiner

Figure 4C:
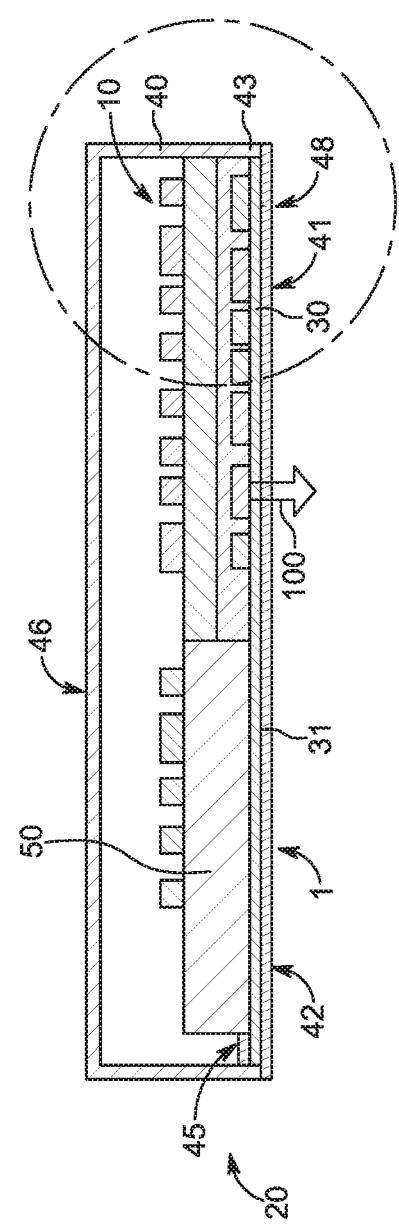
Figure 4D:
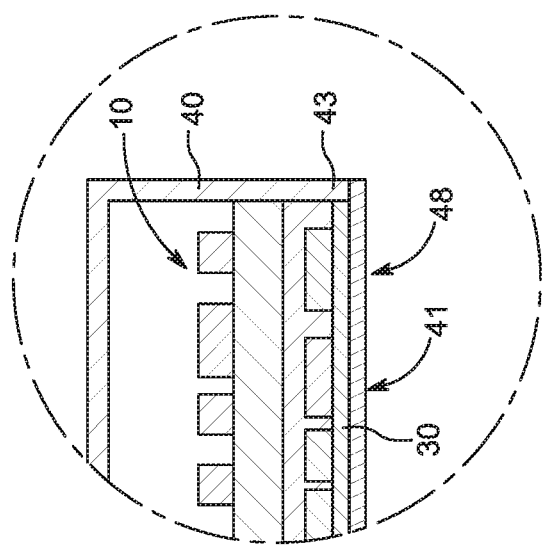

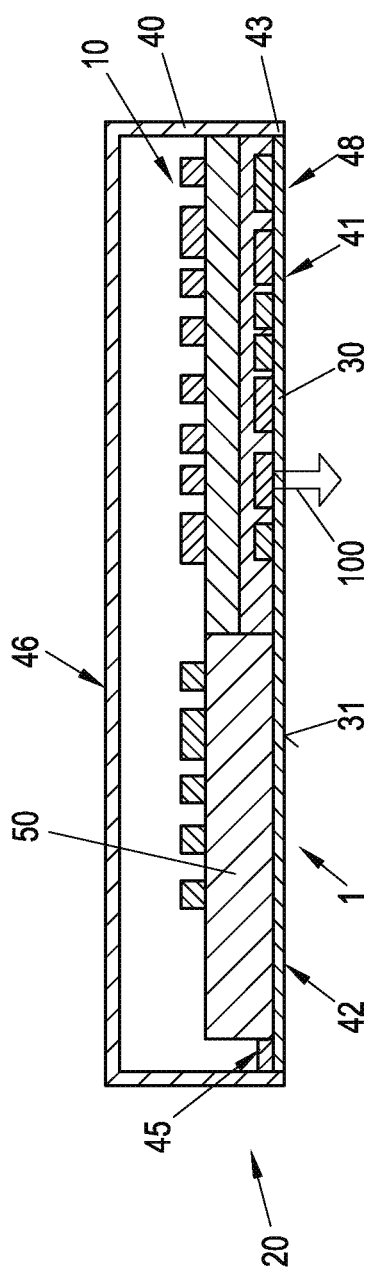
Fig. 4A
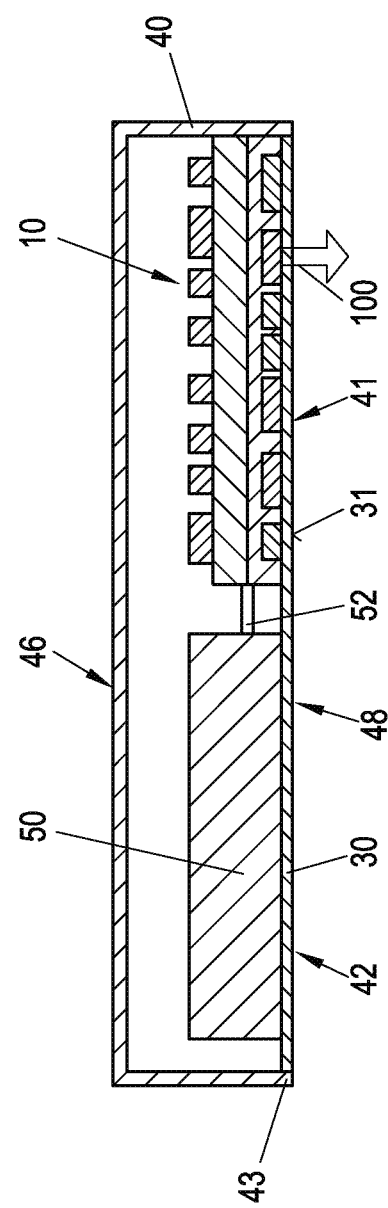
Fig. 4B
Fig. 5

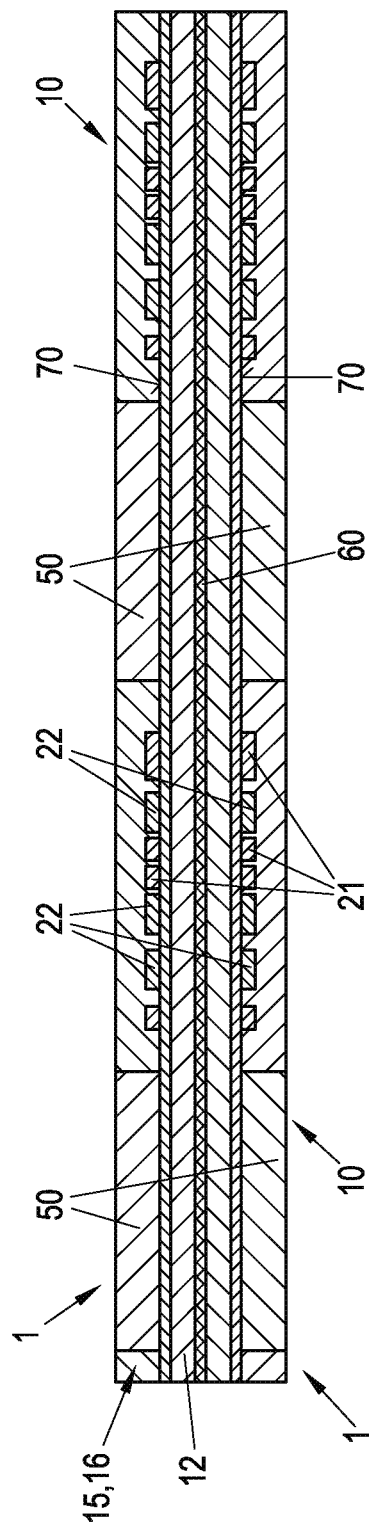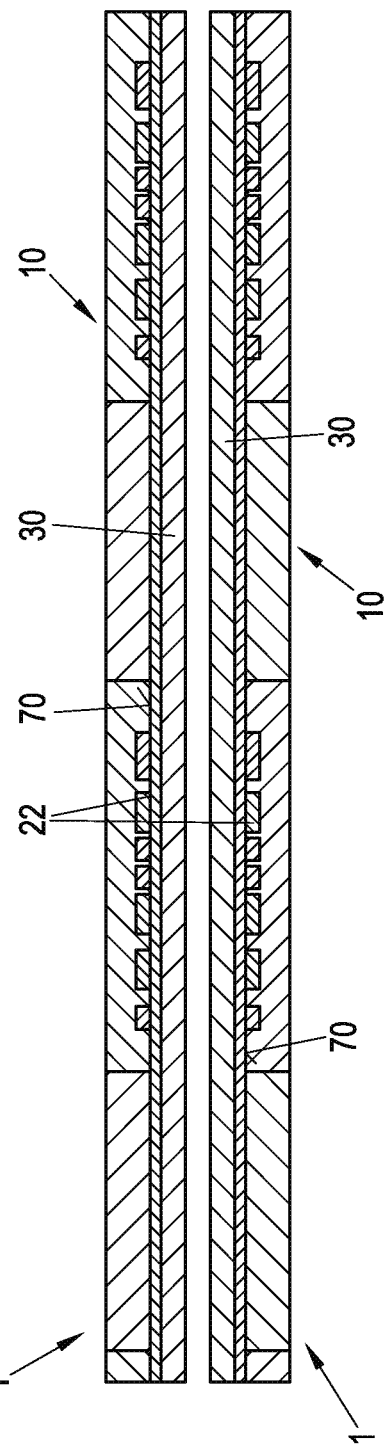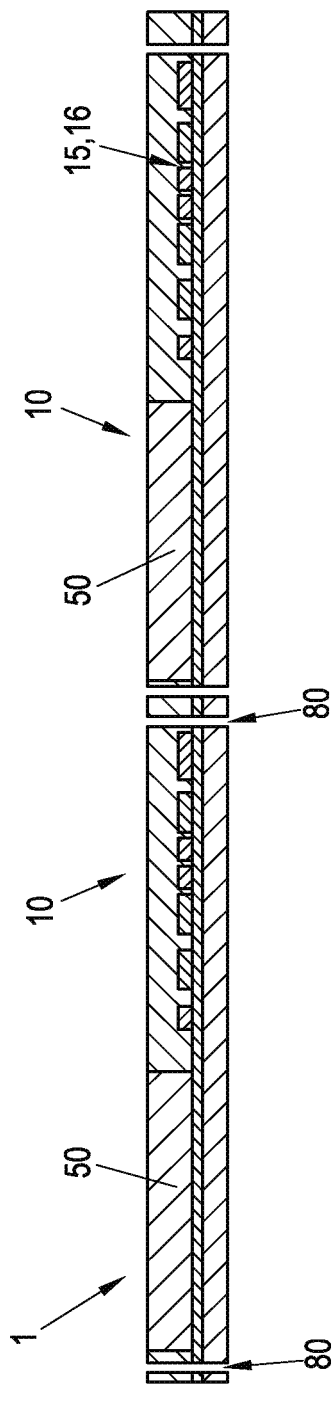

COMPONENT CARRIER AND METHOD TO PRODUCE SAID COMPONENT CARRIER

CROSS REFERENCE TO RELATED APPLICATIONS

This application claims priority to European Application No. 16173562.6 filed on Jun. 8, 2016, the disclosure of which is hereby incorporated by reference in its entirety.

The invention relates to a component carrier for an electronic device, the component carrier comprising at least one heat-releasing component that is embedded within at least one carrier layer of the component carrier, and wherein the at least one embedded heat-releasing component is thermoconductively coupled to a heat spreader layer. Also an electronic device that comprises at least one component carrier according to the invention, as well as a method to produce a respective component carrier are indicated.

An electronic device like a computing or communication device typically comprises at least one improved component carrier like a printed circuit board (PCB), an intermediate printed circuit board product or an IC-substrate, together with components configured in a way to enable the functionality of the electronic device.

In this context the term "component" can be understood as electronic component or electronic chip, respectively. Each active electronic component like a chip, especially a semiconductor chip, or each passive electronic component like a condenser, a resistor, an inductivity or a magnetic element like a ferrite core element, can be a component. Further examples for electronic components that can be embedded within or positioned upon a component carrier are data storage devices like a dynamic random access memory (DRAM), filters that can be configured for example as high-pass filter, low-pass filter or band-pass filter or that can be used as frequency filters. Also an integrated circuit (IC) like a so-called logic IC, any signal processing component like a microprocessor, any performance management component, any opto-electronic device, any voltage converter like DC/DC-converter or AC/DC-converter, any electromechanical converter like a lead-zirconium titanate (PZT)-sensor and/or -actor, as well as any sender unit or receiving unit for electromagnetic waves like a RFID-chip or -transponder, any cryptographic component, capacity, inductivity or switch like a transistor-based switch are comprised alone or combined with the aforementioned or together with other functional electronic components by the aforesaid term of a component or an electronic component, respectively. Furthermore the electronic component can also comprise a microelectromechanical system (short MEMS), a battery, an accumulator, a camera or an antenna.

Further on in this context the term "substrate" can be understood as carrier for electrical connections or electrical networks as well as component carrier comparable to a printed circuit board (PCB), however with a considerably higher density of laterally and/or vertically arranged connections. Lateral connections are for example conducting paths, whereas vertical connections might be for example drill holes. These lateral and/or vertical connections are arranged within the substrate and are commonly used to provide electrical and/or mechanical connections of components or surrounded components, particularly of IC chips, with a printed circuit board or intermediate printed circuit board. Thus the term "substrate" also includes so-called "IC substrates". Such circuit components may be referred to as integrated circuit, chip or microchip, and may be mounted on the surfaces of a conventional printed circuit board as component carrier for example via common surface mount technology (SMT).

To further enhance interconnection properties as well as density of electronic connections of such a component carrier and to reduce its size and thickness, the aforesaid components can also be integrated within the component carrier by embedded component packaging (ECP) technology developed by the applicant.

Nowadays there are countless applications known wherein active or passive electronic components are integrated within the component carrier offering miniaturization and reliability benefits for mobile devices like smartphones and tablet computers—to take one of several examples. Common problem of these miniaturized component carriers is how to efficiently dissipate the off-heat of electronic components with high heat generation and to enhance thermal management of such component carriers that are applied in mobile devices.

For instance the document WO 2014/137749 A1 relates to a manufacturing method of making a smart phone on a chip (SPOC), whereby active or passive components are embedded into a copper core that serves as an embedding substrate. Afterwards printed circuit board (PCB) laminates are layered on both outer sides of the copper core and one or more additional components can be surface-mounted on these laminates. To enhance heat dissipation of the active or passive components that are embedded within the copper core, the copper core includes heat-conducting copper vias in the PCB laminate layers to a top surface of the SPOC and to a copper ground plane, which each allow heat to flow out of the top and bottom of the SPOC, respectively. Disadvantageously the PCB laminate layers that enclose the copper core also insulate the core. Thus heat dissipation is deteriorated by the PCB laminate layers that abut on the copper core.

Document WO 2007/061190 A1 discloses a method of cooling an electronic device that includes a case, a printed circuit board, and internal components. The method includes disposing a heat conductive filler having elasticity on any one of or any combination of a top surface of the printed circuit board, a bottom surface of the printed circuit board, one or more of the internal components, and an inner surface of the case during assembly of the electronic device. After the electronic device has been assembled, the printed circuit, the internal components, and the heat conductive filler are disposed inside the case, and the heat conductive filler is applied and poured in between the internal components and the case. Disadvantageously heat dissipation of heat generating components mainly depends on the quality and arrangement of the respective heat conductive filler applied.

Document U.S. Pat. No. 7,543,374 B2 refers to a method of manufacturing wiring substrate wherein two printed circuit boards (PCB's) are manufactured at once by attaching two bases of the PCB's during manufacture using a temporary carrier. As temporary carrier or temporary substrate, respectively, a nonwoven fabric made of resin coated fibres is taken. On both outer sides of the temporary carrier metal foils are sectionally attached via adhesive layers. On these metal foils further insulating layers and wiring layers are formed. The wiring formation regions in which the temporary substrate and the copper foils simply contact each other are obtained, whereby the copper foils and the build-up PCB wiring layers formed thereon can be separated afterwards from the temporary substrate. To detach the PCB wiring members from the temporary carrier, an inside portion of the PCB structure which is adhered to the temporary carrier is cut out after the manufacturing process. Thus, PCB wiring members each including the metal foil and the build-up wiring layer formed thereon are obtained from both surface sides of the temporary substrate respectively.

An object of the present invention is to avoid the disadvantages known in the art and to provide an improved component carrier with further enhanced heat dissipation capacity that can be built-in or arranged on-board of an electronic device like a mobile phone or a tablet computer.

A further, more specific object of the present invention is to provide an improved component carrier that is robust, can withstand high thermal stress and in unison is thin enough in order to be able to be built-in or be integrated into the flat housing of mobile devices like smartphones and tablet computers.

Another task of the present invention is to provide a method for producing such a component carrier with with further enhanced heat dissipation capacity.

Also another task of the invention is to improve the heat management of an electronic device like a mobile device comprising at least one component carrier and to increase the heat dissipation capability of the said electronic device.

The afore-mentioned objects are solved within the present invention by providing a generic component carrier according to the preamble of claim 1 with the features of the characterizing part of claim 1, whereby the heat spreader layer forms at least an outside section of a casing of said electronic device.

Advantageously according to the invention the heat spreader layer is arranged in a way that it is positioned on an outer side of the component carrier and thus can be used as casing part of the electronic device. Due to its position as outside casing of the device or at least as section of such a casing, the heat spreader layer has enhanced heat dissipation capacity. Dissipation of heat that is generated within the component carrier or the casing of the electronic device, respectively, takes place alongside the heat spreader layer as at least part of the casing of the device into the surroundings of the electronic device. Thus efficient cooling of heat-releasing components that are embedded within the component carrier as well as of those components that are arranged within the casing of the device is ensured. By the current invention a component carrier is provided that can enhance thermal management of electronic devices in general, especially of mobile devices like smartphones and tablet computers with flat design height.

Thermoconductive coupling of the heat-releasing components with the heat spreader layer can be realised in many ways. For example thermally conductive layers that may be one or several resin layers or one or several layers made of metal, thermal vias or direct contacting can be applied to provide proper thermoconductive coupling of the respective heat-emitting components with the heat spreader layer. Thermal conductivity can be further enhanced via at least partial introduction and application, respectively, of alternative materials that are highly thermoconductive. These alternative materials that have particularly enhanced thermoconductive properties can be for example ceramics like aluminium nitride (for short: AlN), silicon carbide, alumina, sapphire, silicon nitride, as well as diamond-like-carbon (for short: DLC) and/or graphite.

The outside surface of the heat spreader layer which surface is also at least a section of the casing section of the electronic device can be designed in a way that matches with other casing parts or the surrounding casing, and to give further examples can be smooth, rough, structured, patterned, ribbed or serrated.

Advantageously the heat spreader layer of a component carrier according to the invention can be arranged as outer carrier layer forming an outside surface of the component carrier. In this embodiment the component carrier itself comprises the heat spreader layer which forms an outer carrier layer of the component carrier and is additionally arranged in a way within the electronic device that it forms at least a part of the outer casing of the respective device.

In an appropriate embodiment of the invention the component carrier can be designed in a way that the at least one embedded heat-releasing component adjoins to the heat spreader layer. In this preferred embodiment the one or more heat-releasing components adjoin the heat spreader layer. Thus thanks to shortened paths for heat, cooling ability of the electronic device as well as conduction heat dissipation capacity are further enhanced.

In another appropriate embodiment of the invention the component carrier can be such executed that the at least one embedded heat-releasing component is directly mounted on the heat spreader layer. Due to direct contacting of the embedded heat-releasing components on the heat spreader layer, off-heat is dissipated via the heat spreader rapidly and efficiently into the surroundings of the component carrier when applied within an electronic device.

Particularly advantageous the component carrier according to the invention can comprise a heat spreader layer that is a core layer made of a solid material, preferably made of metal. In this preferred embodiment for example a metal core layer forms an outside surface of the component carrier and is arranged in a way that it also forms at least a part of the casing of the electronic device. For instance the component carrier is formed by a metal core made of aluminium or an aluminium-based alloy with a single-sided printed circuit board (PCB) with embedded components. Advantageously the solid heat spreader layer enhances stability and robustness of the casing of the electronic device.

In a further alternative embodiment of the invention the component carrier can comprise a heat spreader layer that is made of a composite material, preferably made of a carbon-containing composite material. Here in this alternative version the solid core material of a single-sided PCB is made of a composite material. Advantageously the composite heat spreader layer can match with adjoining or surrounding casing parts of the electronic device. Composite materials that preferably contain carbon-fiber-reinforced plastic (CFRP) may be light-weight and extremely robust, what provides a further advantage as casing materials especially for mobile devices like smartphones or notebook-computers.

Exceptionally appropriate can be a component carrier according to the invention, wherein at least one battery is integrated within the component carrier. Depending on the individual applications one or more batteries can be integrated within the component carrier to further reduce production costs and to enhance convenience of assembly of an electronic device that is equipped with one or more respective component carriers.

Also of advantage can be a component carrier according to the invention, wherein the heat spreader layer can at least be partly covered by a sealing means that protects the heat spreader layer. The at least one sealing means can be used to protect at least surface parts of the heat spreader layer during manufacture against chemical and/or mechanical damages. Thus the sealing means can be arranged in many ways either to cover surface parts or to cover the total surface on one outside or on both outsides of the heat spreader layer. The sealing means can also be provided in a way that mesh with a flanking casing area of said electronic device. As an example a heat spreader layer can be formed as casing cover of the respective electronic device which casing cover can be opened and closed manifold. To ensure tight sealing of the casing cover in regard to the flanking casing area, the heat spreader layer as casing cover can comprise respective sealing means that correspond and mesh with sealing gasket means that may be arranged on the flanking casing area of said electronic device. Thus the heat spreader layer can be used for example as slidable, foldable and/or twistable casing cover. The sealing gasket means of the respective electronic device may comprise rubber seals, mechanical lock seals like zip lock seals or respective liquid-tight or gas-tight sealants.

In a further development of the invention a component carrier can comprise sealing means that at least temporarily protect the heat spreader layer during manufacture. In this embodiment the sealing means can be for example a removable protection film or a removable protective foil that can be peeled off after certain manufacture steps or after manufacture, respectively.

According to another advantageous embodiment of the invention the heat spreader layer of a component carrier can be at least partly covered by a surface-finishing means that is attached to the heat spreader layer and patterns its surface. The at least one surface-finishing means can either be attached before, during or after manufacture of the component carrier. Attaching the surface-finishing means can be realized for example by chemical, mechanical, thermal and/or thermomechanical processes like coating-, gluing-, or vapor deposition processes. The surface-finishing means can fulfil multiple functions to pattern at least parts of the surface of the heat spreader layer. The surface-finishing means can for example be a scratch-resistant coating or foil that covers the outer surface of the heat spreader layer and has the same haptic perception like the surrounding casing material. Depending on the circumstances the surface-finishing means can also be applied in one or in different colours or design patterns to fit with the neighbouring casing material of the electronic device.

The afore-mentioned objects are also solved within the present invention by providing an electronic device according to the features of claim 11, whereby the electronic device comprises at least one component carrier according to the invention, wherein at least one heat-releasing component is embedded in the component carrier and is thermoconductively coupled to a heat spreader layer, and wherein the heat spreader layer forms at least an outside section of a casing of said electronic device.

The aforesaid advantages and improvements in respect to the inventive component carrier equally pertain to a respective electronic device that is equipped with at least one component carrier according to the invention.

In a further preferred embodiment of the invention the electronic device can be designed in a way that the at least one heat-releasing component adjoins to or is directly mounted on the heat spreader layer.

Appropriately the electronic device according to the invention can comprise a heat-releasing component that comprises an inlay structure, preferably an inlay structure made of copper, that enhances heat transfer. This inlay structure that is preferably made of copper further enhances the heat transfer.

In a further advantageous embodiment of the invention the electronic device can comprise a heat spreader layer that provides sealing means which mesh with a flanking casing area of said electronic device.

The afore-mentioned objects are also solved within the present invention by providing a manufacturing method of a component carrier, which method comprises the following steps:
Providing two solid heat spreader layers,
Providing a temporary adhesive layer,
Arranging the temporary adhesive layer between the two solid heat spreader layers,
Optionally coating the outside surfaces of the heat spreader layers with at least one thermally conductive layer,
Mounting components, preferably heat-releasing components, onto the outside surfaces of the heat spreader layers or on the at least one thermally conductive layer attached thereto,
Optionally attaching at least one battery onto each outside surface of the heat spreader layers or the at least one thermally conductive layer,
Forming at least one carrier layer of a component carrier onto the outside surfaces of the heat spreader layers or the at least one thermally conductive layer, whereby the at least one carrier layer embeds the mounted components and/or the attached batteries,
Separating the temporarily adhered heat spreader layers along with the built-up component carrier structure,
Possibly cutting sections of the heat spreader layer via a cutting tool and/or milling tool to obtain a single component carrier.

To utilize the benefits of the invention and to enhance the thermal management of a component carrier like a PCB with embedded heat-releasing components, the built-up component carrier structure that is arranged on a heat spreader layer can be manufactured only single-sided as the opposite surface of the heat spreader layer forms at least partly the outside casing of the electronic device. To overcome this drawback and to enhance production speed, two heat spreader layers that are each taken as base or core material and on which a component carrier structure is built up, are arranged via a temporary adhesive layer between the two solid heat spreader layers in a way that layer built-up on the heat spreader layers can be performed on both sides of the temporarily-attached solid heat spreader layers simultaneously.

When built-up of the component carrier structure on the heat spreader layers is finished, the temporarily adhered heat spreader layers along with the built-up component carrier structure are separated. Afterwards possibly sections of the heat spreader layer are cut via a cutting tool and/or milling tool to obtain several single component carriers.

Manufacture of the component carrier can be performed preferably by Embedded Components Packaging (ECP) technology as developed by the applicant. This is a laminate-based component embedding technology leveraging the core principles of PCB manufacturing. It is a combination of state of the art HDI micro via technology, ultra-fine line technology and a component assembly technology based on modified semi-additive technology and component assembly technology adapted for embedding passive as well as active components.

Other objects, advantages and novel features of the present invention will become more apparent from the following detailed description when taken in conjunction with the accompanying schematic drawings.

Figure 1A:
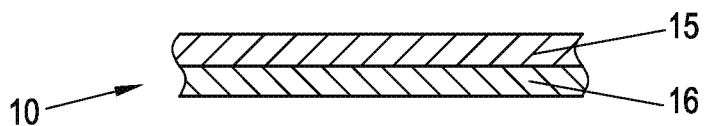
Figure 1B:
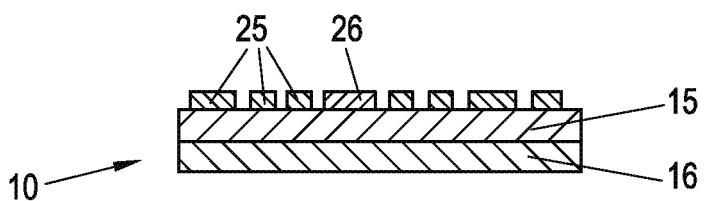
Figure 1C:
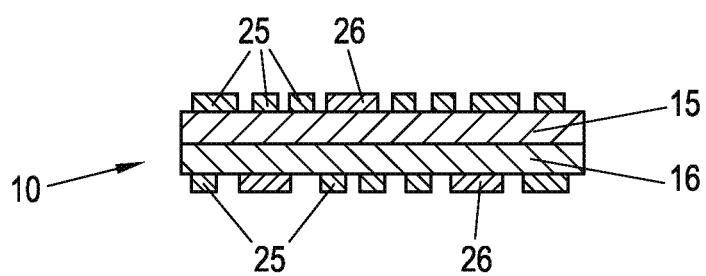
Figure 1D:
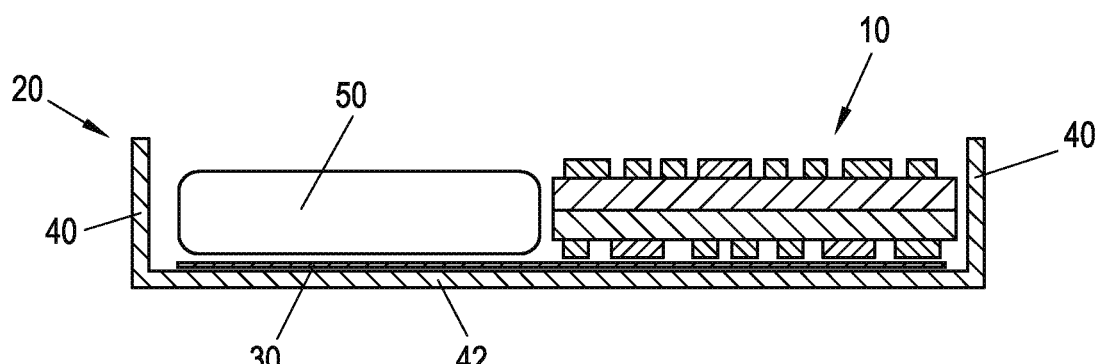
Figure 1E:
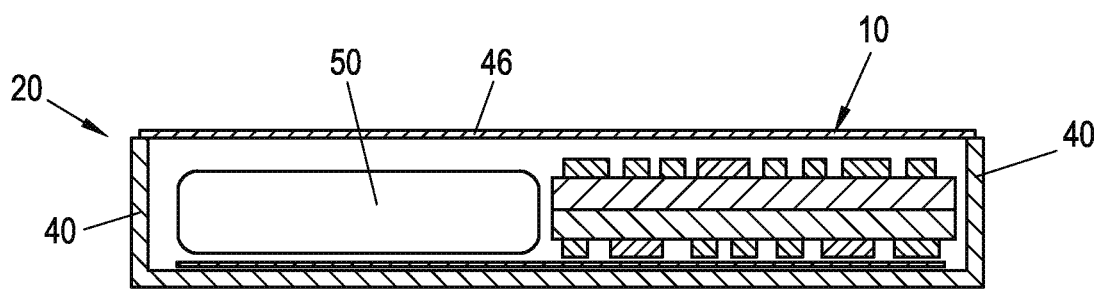

FIG. 1A to FIG. 1E each refer to the known state of the art and show each in sectional views from the side in successive manufacturing steps in FIG. 1A a conventional multilayer printed circuit board (PCB), FIG. 1B the multilayer printed circuit board of FIG. 1A with surface-mounted components arranged on a first side of the multilayer printed circuit board, FIG. 1C the multilayer printed circuit board as of FIG. 1B with surface-mounted components arranged on an opposite second side of the multilayer printed circuit board, FIG. 1D the intermediate PCB product as of FIG. 1C assembled together with a battery in a bottom casing of an electronic device, FIG. 1E the bottom casing as of FIG. 1D covered by a top display casing to receive a conventional electronic device.

Figure 2A:
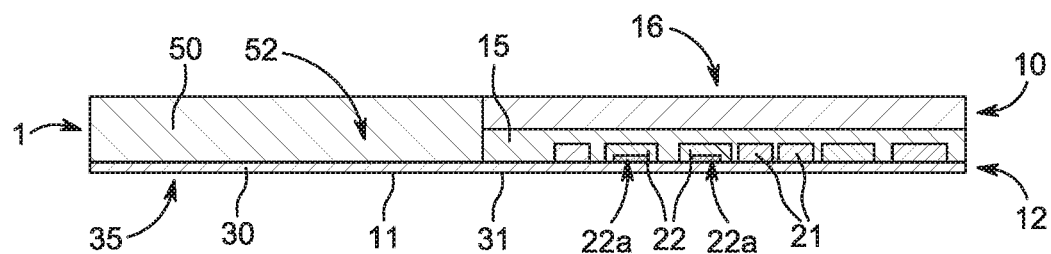
Figure 2B:
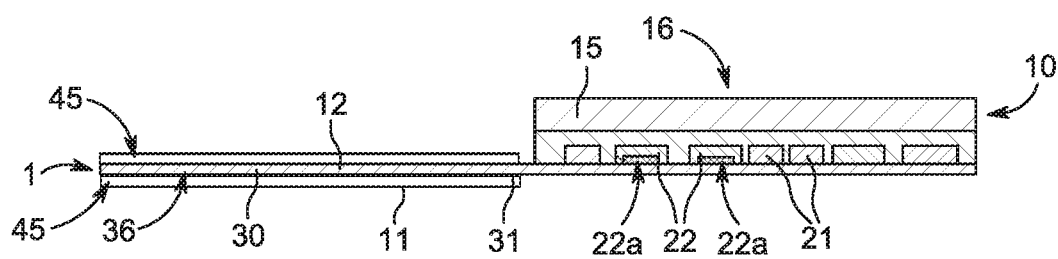
Figure 3A:
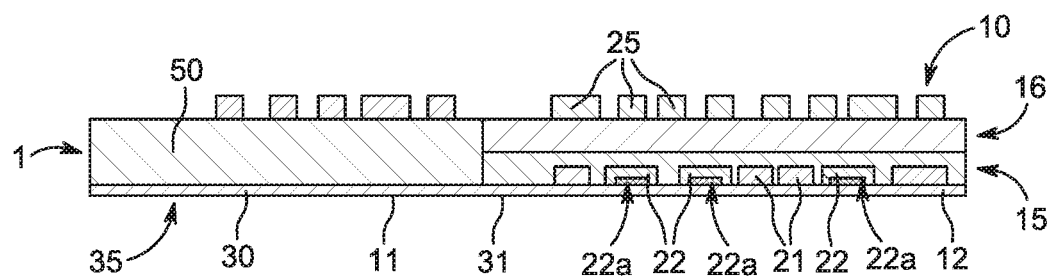
Figure 3B:
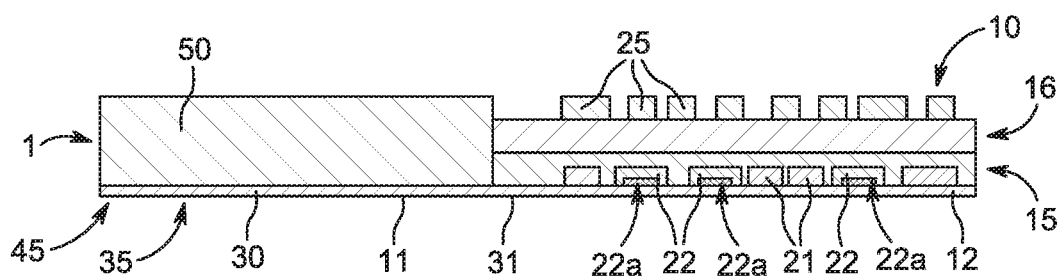

The further drawings FIG. 2A to FIG. 4B each refer to the invention of a component carrier and an electronic device, respectively, with enhanced thermal-management properties, and show in sectional views from the side in FIG. 2A a first embodiment of the invention of a component carrier with embedded components that are attached on a heat spreader layer, wherein a battery is integrated in the component carrier;

FIG. 2B a second embodiment of the invention of a component carrier without battery;

FIG. 3A the component carrier according to FIG. 2A, wherein surface-mounted components are arranged on the component carrier;

FIG. 3B the component carrier according to FIG. 2B, wherein surface-mounted components are arranged on the component carrier and a separate battery is mounted on the heat spreader layer;

FIG. 4A the component carrier according to FIG. 3A assembled in a casing of an electronic device;

FIG. 4B the component carrier according to FIG. 3B assembled in a casing of an electronic device.

The further drawings FIG. 5 to FIG. 8 each refer to the invention of a manufacturing method to produce a component carrier for an electronic device, and show in sectional views from the side in FIG. 5 a base material arranged by two heat spreader layers that are connected together via a temporary adhesive layer;

FIG. 6 the base material as shown in FIG. 5 after built-up of a component carrier structure with embedded components and integrated batteries on each of the outside surfaces of the heat spreader layers;

FIG. 7 the finished component carrier structures on the heat spreader layers as depicted in FIG. 6 after separating the temporarily adhered heat spreader layers;

FIG. 8 one separated heat spreader layer as shown in FIG. 7 after cutting the heat spreader layer via a cutting tool and/or milling tool to obtain several single component carriers according to the invention.

FIG. 1A depicts a conventional multilayer printed circuit board 10 (PCB) with several layers 15, 16. FIG. 1B shows the multilayer PCB of FIG. 1A with surface-mounted components 25, 26 that are arranged on a first side which is here the top side of the multilayer printed circuit board 10. The surface-mounted components 25 are here for example passive components. The surface-mounted components 26 are for example heat-releasing, active components 26. FIG. 1C shows the PCB as of FIG. 1B with additional surface-mounted components 25, 26 that are arranged on an opposite second side of the multilayer printed circuit board 10 which is here the bottom side. FIG. 1D depicts the intermediate PCB product 10 as of FIG. 1C assembled together with a battery 50 in a bottom casing 42 which is part of the casing 40 of an electronic device 20 like a smartphone. The conventional PCB product 10 is placed on a separated heat spreader layer 30 that is mounted on the inside of the bottom casing 42 to distribute the off-heat that is dissipated by the surface-mounted heat-releasing components 26. FIG. 1E shows the bottom casing 42 as of FIG. 1D covered by a top display casing 46 to receive a complete casing 40 of a conventional electronic device 20.

The following FIGS. 2A, 3A and 4A each refer to a component carrier 1 according to a first embodiment of the invention, wherein the component carrier 1 comprises embedded components 21, 22 that are attached on a heat spreader layer 30. Furthermore, a battery 50 is integrated in the component carrier 1. FIG. 2A shows the component carrier 1 with a multi-layered printed circuit board (PCB) 10, wherein the embedded components 21 and embedded heat-releasing components 22 are embedded within a first inner carrier layer 15 of the component carrier 1. The embedded components 21, 22 are covered by at least another, second inner carrier layer 16 and adjoin to the heat spreader layer 30 which forms an outer carrier layer 12 of the component carrier 1 and the layered PCB 10, respectively. The carrier layer 12—which is here an aluminum core layer—also forms with its outside surface 11 of the component carrier 1 an outside surface 31 of the heat spreader layer 30. The heat spreader layer 30 is made here of a solid material 35. In FIG. 3A surface-mounted components 25 are shown that are arranged on the component carrier 1 on an inner carrier layer 16. FIG. 4A shows the component carrier 1 according to FIG. 3A assembled in a casing 40 of an electronic device 20. The heat spreader layer 30 is a casing section 41, more precisely of the bottom casing 42, of the device 20. Thus the outside surface 31 of the heat spreader layer 30 is also part of the casing 40. Optionally the upper outside of the heat spreader layer 30 is at least partly covered by sealing means 45 that mesh with a flanking casing area 43 of the electronic device 20. The sealing means 45 protects the heat spreader layer 30 against damages and/or chemical stress. The outside surface 31 of the heat spreader layer 30 is here at least partly covered by a surface-finishing means 48 that patterns the visible outside 31 of the heat spreader layer 30. Thus by means of the surface-finishing means 48 the heat spreader layer 30 can be adapted in a way to match with the colour, haptic perception and/or the design pattern of the casing 40. Dissipated off-heat that is released from the embedded heat-releasing components 22 via the heat spreader layer 30 to the surroundings is depicted via a heat conduction 100 arrow.

The FIGS. 2B, 3B and 4B each refer to a component carrier 1 according to a second embodiment of the invention, wherein the component carrier 1 comprises embedded components 21, 22 that are attached on a heat spreader layer 30. A battery 50 is here not integrated in the component carrier 1, but can be mounted onto the outer carrier layer 12 which is the heat spreader layer 30 as add-on. The carrier layer 12—which is here made of a carbon-containing composite material—also forms with its outside surface 11 of the component carrier 1 an outside surface 31 of the heat spreader layer 30. FIG. 2B shows the component carrier 1 without battery 50. Sealing means 45 cover here at least parts of both surfaces—the upper as well as the lower—of the heat spreader layer 30. These sealing means 45 that are applied here protect the heat spreader layer 30 against damages due to chemical and/or mechanical stress during manufacture of the component carrier 1 and can be peeled off after manufacture. The heat spreader layer 30 is made here of a solid material 35 like a metal core layer 36. FIG. 3B shows the component carrier 1 according to FIG. 2B, wherein surface-mounted components 25 are arranged on the component carrier and a separate battery 50 is mounted on the heat spreader layer 30 which battery 50 is connected via electric contacts 52 with the respective wiring that is not shown. FIG. 4B shows the component carrier 1 according to FIG. 3B assembled in a casing 40 of an electronic device 20. The lower outside surface 31 of the heat spreader layer 30 is here at least partly covered by a surface-finishing means 48 that patterns the visible outside 31 of the heat spreader layer 30.

The further drawings FIG. 5 to FIG. 8 each refer to the invention of a manufacturing method to produce a component carrier 1 for an electronic device 20. FIG. 5 depicts a base material that is arranged by two heat spreader layers 30 that are provided and connected together via a temporary adhesive layer 60 that is arranged between the two solid heat spreader layers 30. In an optional manufacturing step the outside surfaces 31 of the heat spreader layers 30 are here coated with a thermally conductive layer 70.

FIG. 6 shows the base material as shown in FIG. 5 after built-up of a component carrier 1 structure with embedded components 21, 22 and integrated batteries 50 on each of the outside surfaces 31 of the heat spreader layers 30. Thus components 21 and heat-releasing components 22 are mounted onto the outside surfaces 31 of the heat spreader layers 30 or on the thermally conductive layers 70 attached thereto. As an optional manufacturing step batteries 50 are attached onto each outside surface 31 of the heat spreader layers 30 or the thermally conductive layers 70. Afterwards at least one carrier layer 12, 15, 16 of a component carrier 1, 10 is formed onto the outside surfaces 31 of the heat spreader layers 30 or the thermally conductive layers 70, whereby the at least one carrier layer 12, 15, 16 embeds the mounted components 21, 22 and at least surrounds the attached batteries 50. The printed circuit board 10 can comprise one or several carrier layers 15, 16, that are here in FIGS. 6 to 8 shown for ease of depiction as one carrier layer 15, 16.

FIG. 7 depicts the finished component carrier 1 structures on the heat spreader layers 30 as depicted in FIG. 6 after separating the temporarily adhered 60 heat spreader layers 30.

FIG. 8 refers to one separated heat spreader layer 30 as shown in FIG. 7 after cutting the heat spreader layer 30 in lateral direction via a not shown cutting tool and/or milling tool in cutting sections 80 to obtain several single component carriers 1 according to the invention. The cutting sections 80 are depicted in FIG. 8 as gaps between the neighboring component carriers 1.

What is claimed is:

1. A component carrier formed of a printed circuit board, an intermediate printed circuit board product, or an IC-substrate disposed in an electronic device wherein the electronic device comprises a casing on the outside of the component carrier wherein the casing further comprises a first component and a second component; and wherein the component carrier is a multi-layer component carrier that further comprises at least one heat-releasing component that is embedded within at least one carrier layer of the component carrier such that the at least one heat-releasing component does not extend through the component carrier, and wherein the at least one embedded heat-releasing component is thermoconductively coupled to a heat spreader layer, wherein the heat spreader layer is one carrier layer of the multi-layer component carrier and forms the second component of the casing of said electronic device.

2. The component carrier according to claim 1, wherein the heat spreader layer is arranged as outer carrier layer forming an outside surface of the component carrier.

3. The component carrier according to claim 1, wherein the at least one embedded heat-releasing component adjoins to the heat spreader layer.

4. The component carrier according to claim 1, wherein the at least one embedded heat-releasing component is directly mounted on the heat spreader layer.

5. The component carrier according to claim 1, wherein the heat spreader layer is a core layer made of a solid material.

6. The component carrier according to claim 1, wherein the heat spreader layer is made of a composite material.

7. The component carrier according to claim 1, wherein at least one battery is integrated within the component carrier.

8. The component carrier according to claim 1, wherein the heat spreader layer is at least partly covered by a sealing means that protects the heat spreader layer.

9. The component carrier according to claim 8, wherein the sealing means at least temporarily protects the heat spreader layer during manufacture.

10. The component carrier according to claim 1, wherein the heat spreader layer is at least partly covered by a surface-finishing means that is attached to the heat spreader layer and patterns its surface.

11. An electronic device, comprising at least one component carrier according to claim 1, wherein at least one heat-releasing component is embedded in the component carrier and thermoconductively coupled to a heat spreader layer, wherein the heat spreader layer forms at least a section of the casing of said electronic device.

12. The electronic device according to claim 11, wherein the at least one heat-releasing component adjoins to or is directly mounted on the heat spreader layer.

13. The electronic device according to claim 11, wherein the heat-releasing component comprises an inlay structure, preferably an inlay structure made of copper, that enhances heat transfer.

14. The component carrier according to claim 5, wherein the heat spreader layer is made of metal.

15. The component carrier according to claim 6, wherein the heat spreader layer is made of a carbon-containing composite material.

* * * * *